(12) United States Patent
Arai

(10) Patent No.: US 6,198,152 B1
(45) Date of Patent: *Mar. 6, 2001

(54) SEMICONDUCTOR DEVICE

(75) Inventor: Hajime Arai, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/122,764

(22) Filed: Jul. 27, 1998

(30) Foreign Application Priority Data

Feb. 5, 1998 (JP) .................................. 10-024657

(51) Int. Cl.$^7$ ..................................................... H01L 29/00
(52) U.S. Cl. .......................................... 257/529; 257/371
(58) Field of Search ..................................... 257/529, 371

(56) References Cited

U.S. PATENT DOCUMENTS

| | | | | |
|---|---|---|---|---|
| 4,581,628 | * | 4/1986 | Miyauchi et al. | 257/529 |
| 4,628,590 | * | 12/1986 | Udo et al. | 257/529 |
| 4,692,190 | * | 9/1987 | Komatsu | 257/529 |
| 4,723,155 | * | 2/1988 | Uchida | 257/529 |
| 5,025,298 | * | 6/1991 | Fay et al. | 257/529 |
| 5,292,681 | * | 3/1994 | Lee et al. | 438/201 |
| 5,675,174 | * | 10/1997 | Nakajima et al. | 257/529 |
| 5,726,488 | * | 3/1998 | Watanabe et al. | 257/655 |

FOREIGN PATENT DOCUMENTS

| | | |
|---|---|---|
| 3-083361 | 4/1991 | (JP) . |
| 9-017874 | 1/1997 | (JP) . |

* cited by examiner

*Primary Examiner*—J. Carroll
(74) *Attorney, Agent, or Firm*—McDermott, Will & Emery

(57) ABSTRACT

A laser trimming link is provided on a field oxide film. An N well is formed below the field oxide film and in the surface of a semiconductor substrate. N well is formed of a retrograde well.

8 Claims, 6 Drawing Sheets

SEMICONDUCTOR DEVICE

BACKGROUND OF THE INVENTION

1. Field of the Invention

The present invention relates generally to semiconductor devices, and more particularly to semiconductor devices allowing improved production yield and device characteristic control by employing laser trimming.

2. Description of the Background Art

In a semiconductor memory device having an MOS (Metal Oxide Silicon) configuration, spare memory cells are generally arranged in order to increase production yield. These replaced defective memory cells if necessary, in order to repair pattern defects caused in the manufacturing process.

Referring to and compared with cells shown in FIG. 9, a memory cell used in the present invention will be described.

With reference to FIG. 9, it is difficult to increase the capacity of a byte-erasable EEPROM (electrically erasable programmable ROM) because a select transistor included in the EEPROM increases the cell area. In an EPROM(erasable programmable ROM), writing is performed electrically and erase is performed collectively by ultraviolet radiation. As shown in the figure, a simple configuration having one transistor per one cell allows a small cell area. In a flash memory, collective erase performed by ultraviolet radiation in the EPROM is replaced by electrical erase achieved by charge ejection utilizing tunnel effect caused by the applied high electric field. As a result, non-volatility, electrical rewrite and erasure, and increased capacity can be obtained at the same time.

Among a number of approaches for the replacement of a spare memory cell, a laser trimming method (hereinafter is referred to as LT method) is commonly performed, in which a link is blown by laser radiation to replace a defective cell with a spare one. The LT method is also used for the fine control of reference voltage, for example, generated in the semiconductor device.

Conventionally a final protection film is formed after the LT blow process in order to prevent water and contamination from entering through the portion blown by LT process. In this approach, however, pattern defect which occurred in the final process after yield-enhancing LT blow cannot be corrected. Further, particle are generated at the time of LT blow, increasing pattern defect.

To solve the above mentioned problem, in some cases the LT blow process is performed after the formation of the final protection film. This case will be described referring to the figures.

FIG. 10 is a sectional view of a semiconductor device having an LT link portion (fuse portion).

Referring to FIG. 10, a P well 2 and an N well 3 are formed on the main surface of a semiconductor substrate 1. An isolation oxide film 5 is formed in the main surface of P well 2. An LT link 8 is formed on isolation oxide film 5. A gate electrode 7 is also formed on P well 2 with a gate insulation film 6 posed therebetween. At each side of gate electrode 7, are formed N type diffusion layers 10 which are to be source/drain of an N type channel transistor (NchTr).

A side wall spacer 9 is formed on the sidewall of gate electrode 7. A P type channel transistor (PchTr) is formed in N well 3. The P type channel transistor includes a gate insulation film 6, a gate electrode 7 and P type diffusion layers 11 which are to be source/drain of the P type channel transistor. An interlayer insulation film 12 formed of a BPSG film and the like is provided on semiconductor substrate 1 so as to cover gate electrode 7 and LT link 8.

A contact hole 13 is formed in interlayer insulation film 12 in order to expose the surfaces of P type diffusion layer 11, N type diffusion layer 10 and LT link 8. An interconnection 14 formed of aluminum alloy and so on is connected to LT link 8, N type diffusion layer 10 and P type diffusion layer 11 through contact hole 13. A final protection film 15 is formed on interlayer insulation film 12 so as to cover interconnection 14. Referring to FIG. 11, laser trimming of LT link 8 allows the replacement of a defective memory cell with a spare memory cell.

In the conventional system, however, as can be seen from FIG. 11, semiconductor substrate 1 is exposed at the blown LT link. Therefore water and contamination such as sodium (Na) may easily enter the semiconductor device from outside through the exposed portion. When water or contamination enters the semiconductor device region where an active element resides, characteristics of transistors may fluctuate. Especially in the case of a non-volatile semiconductor memory device such as an EPROM and a flash memory, stored content which has been retained may volatilize, and a defect may be induced leading to the reliability degradation of the semiconductor device.

SUMMARY OF THE INVENTION

The present invention has been made to solve the above described problems, and an object is to provide a semiconductor device having a high reliability even after the LT blow following the formation of a final protection film.

In accordance with a first aspect of the invention, a semiconductor device includes a semiconductor substrate. In the main surface of the semiconductor substrate, a field oxide film for isolating element regions from each other is formed. On the field oxide film, a link to which laser trimming is to be performed is formed. An N well is formed under the field oxide film and in the surface of the semiconductor substrate. The N well is formed of a retrograde well.

According to the present invention, substances such as sodium ions entering from an opening of the semiconductor device cannot reach an active region. As the opening formed by LT blow resides in an N well region, entering substances are gettered by N type impurity in the N well. Thus a highly reliable semiconductor device can be obtained.

In a semiconductor device according to a second aspect, when a depth into the surface of the semiconductor substrate is plotted on abscissa and impurity concentration on ordinate, the impurity concentration profile of the retrograde well has at least two concentration peaks. This impurity concentration profile achieves an efficient distribution of N type impurity in the N well.

In a semiconductor device according to a third aspect, among a plurality of concentration peaks, the impurity concentration of the peak at the deepest point in the surface of the semiconductor substrate is higher than that of another peak. In accordance with the present invention, sodium ions and so on entering from the opening formed by LT blow is efficiently gettered by high concentration N type impurity.

According to a fourth aspect of the invention, the deepest peak resides at 1–3 micrometers in the surface of the semiconductor substrate. This invention provides relatively deep N well.

A semiconductor device according to a fifth aspect provides the concentration of the N type impurity at the deepest peak of $1\times10^{17}$ atoms/cm$^3$. In the present invention, a high concentration of N type impurity allows an efficient gettering of sodium ions and so on entering through the opening after the LT blow process.

In a semiconductor device according to a sixth aspect, the N type impurity is formed of P (phosphorous).

As P easily enters a crystal lattice, the use of P as an N type impurity is convenient for the formation of N well.

In a semiconductor device according to a seventh aspect, an MOSFET is formed in the element region. The MOSFET having a high reliability is provided in accordance with the present invention.

In a semiconductor device according to an eighth aspect, an EPROM is formed in the element region. The EPROM having a high reliability is provided in accordance with the present invention.

In a semiconductor device according to a ninth aspect, an EEPROM is formed in the element region. In this invention, The EEPROM attains a high reliability.

In a semiconductor device according to a tenth aspect, a flash memory is formed in the element region. A flash memory according to the present invention achieves a high reliability.

According to an eleventh aspect, a semiconductor device includes a semiconductor substrate. A field oxide film is formed in the main surface of the semiconductor substrate in order to isolate element isolation regions from each other. A laser trimming link is provided on the field oxide film. A P well is formed directly below the field oxide film in the surface of the semiconductor substrate. An N well is formed below the P well in the semiconductor substrate such that it horizontally extends to contact the P well. A second N well is formed in the semiconductor substrate so as to laterally surround the P well and to connect to the first N well.

In accordance with the present invention, externally entering sodium ions and so on are gettered by the first and the second N wells. Therefore entering substances such as sodium ions cannot reach the active region whereby a semiconductor device having a high reliability is obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to the figures, the preferred embodiments of the invention will be described hereinafter.

First Embodiment

Figure 1:
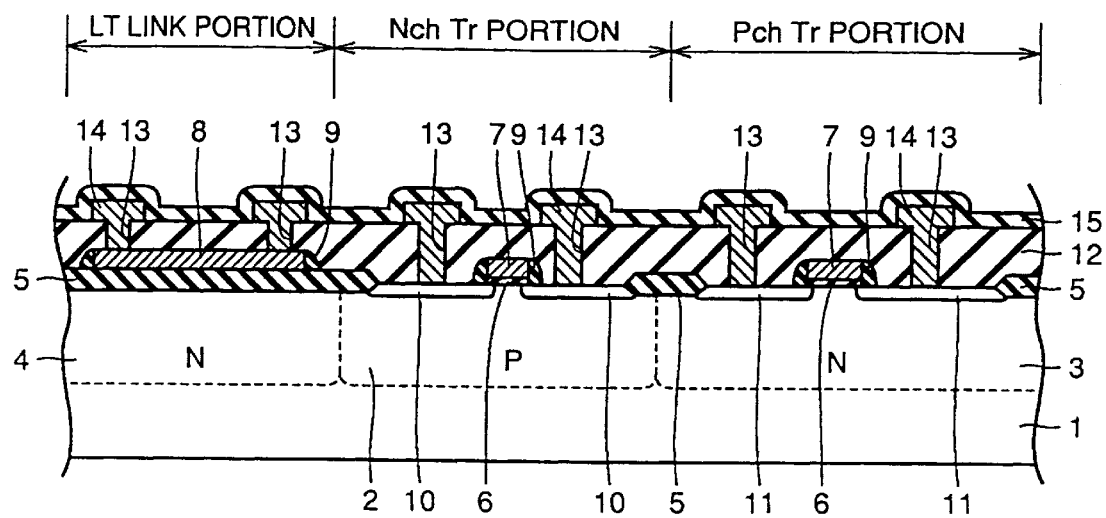
FIG. 1 is a sectional view of a semiconductor device according to a first embodiment.

FIG. 1 is a sectional view of a semiconductor device according to a first embodiment. Referring to FIG. 1, an N well 4, a P well 2 and an N well 3 formed of a retrograde well is provided in the main surface of a semiconductor substrate 1. N well 4, P well 2 and N well 3 include an LT link portion, an N channel transistor portion and a P channel transistor portion, respectively. The configurations of the LT link portion, the N channel transistor portion and the P channel transistor portion are the same as those in a semiconductor device shown in FIG. 9. The same or corresponding portion will be denoted by the same reference number and description thereof will not be repeated.

Figure 9:
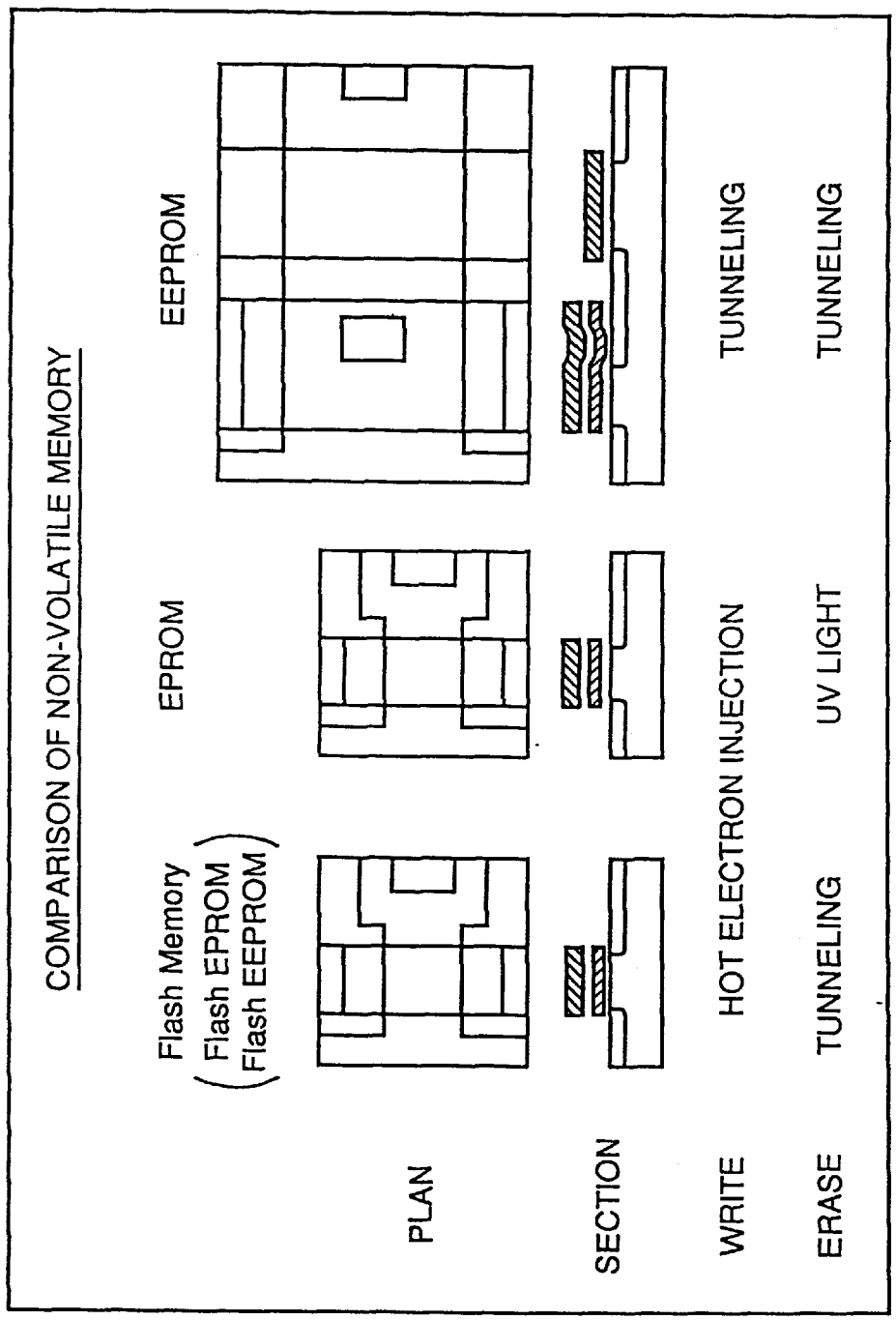
FIG. 9 is a drawing showing a conventional flash memory, an EPROM and an EEPROM in comparison with each other.
Figure 10:
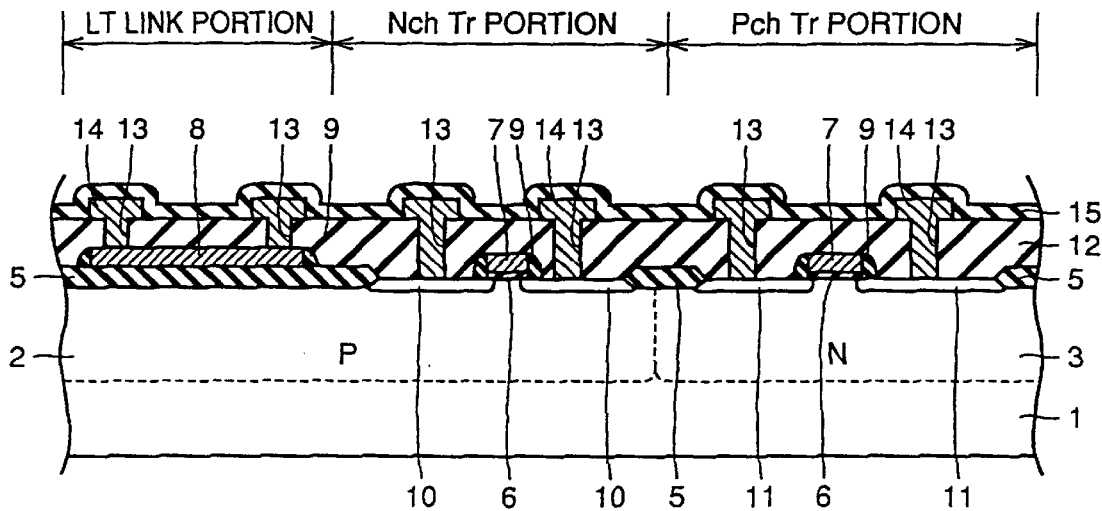
FIG. 10 is a sectional view of a conventional semiconductor device.
Figure 11:
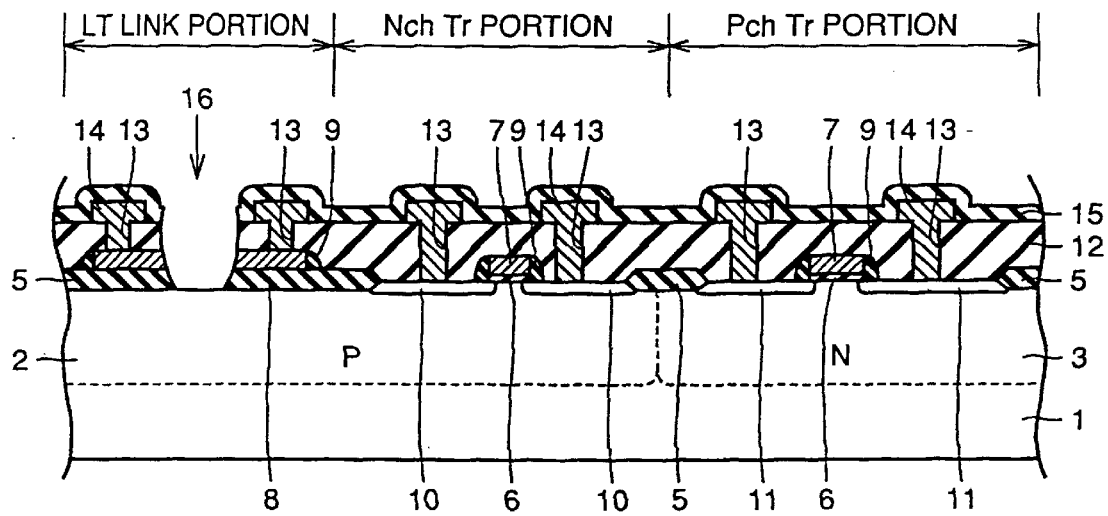
FIG. 11 is a sectional view of a conventional semiconductor device after the LT blow.

The semiconductor device of the first embodiment shown in FIG. 1 differs from the conventional device shown in FIG. 9 in that N well 4 is formed directly below a field oxide film 5 in the surface of semiconductor substrate 1.

Figure 2:
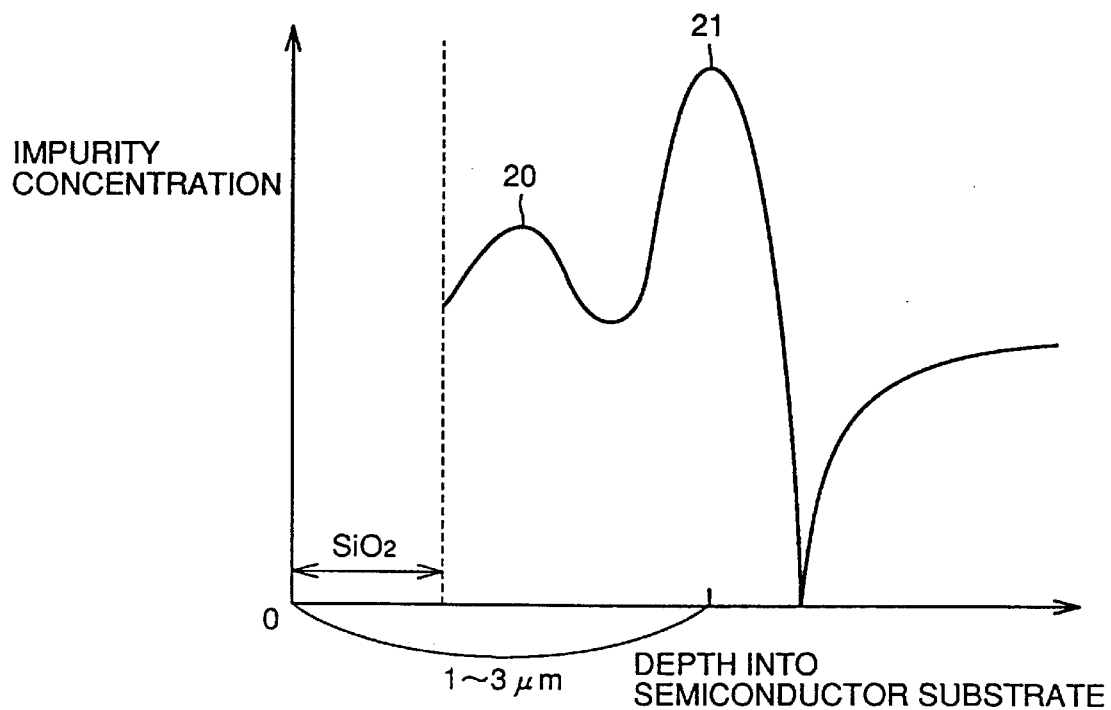
FIG. 2 is a graph showing an impurity concentration profile of an N well 4 included in the semiconductor device according to the first embodiment.

FIG. 2 is a graph showing the impurity concentration profile of N well 4. When the depth into the surface of semiconductor substrate is plotted on abscissa and impurity concentration on ordinate, the impurity concentration profile of N well 4 has at least two concentration peaks 20 and 21. Peak 21 buried at the deeper point in the surface of the semiconductor substrate has a higher concentration than the other peak 20. Deepest peak 21 is buried 1–3 micrometers into the surface of the semiconductor substrate. The concentration of N type impurity at deepest peak 21 is not less than $1\times10^{17}$ atoms/cm$^3$. P is used as an N type impurity because it easily enters a crystal lattice. With As, although it is an N type impurity, it is difficult to form a retrograde well.

Figure 3:
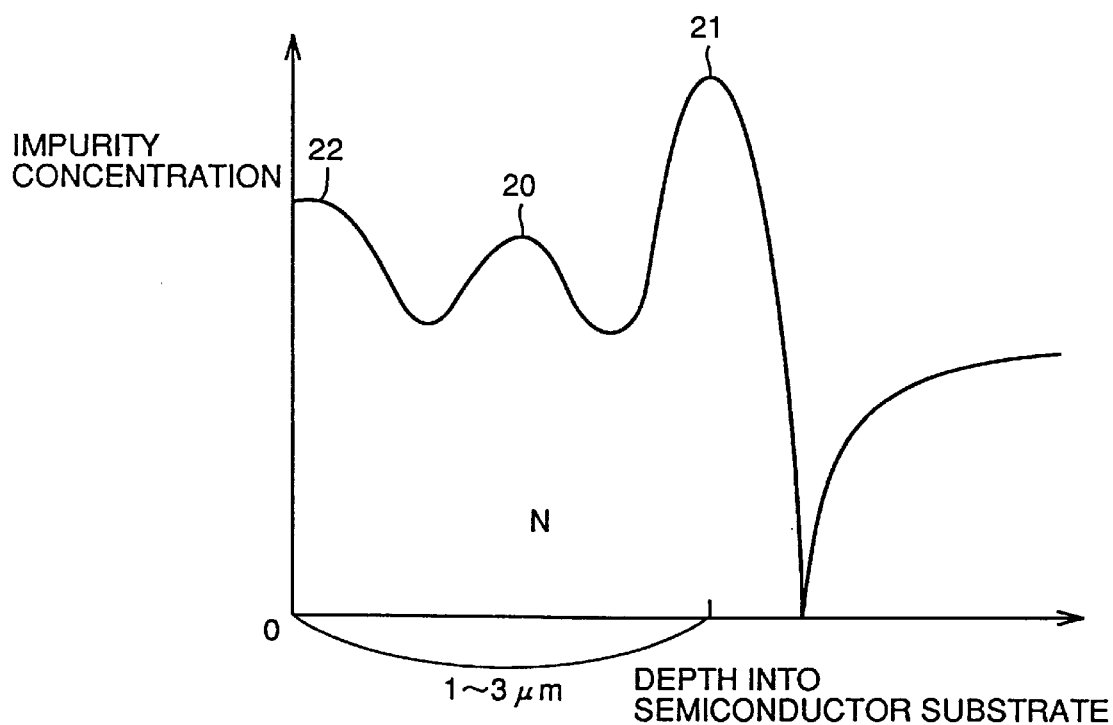
FIG. 3 is a graph showing an impurity concentration profile of an N well 3 included in the semiconductor device according to the first embodiment.

FIG. 3 shows the impurity concentration profile of N well 3, which is provided with three concentration peaks including a peak 22 buried near the surface of the semiconductor substrate, a peak 21 furthest from the surface, and a peak 20 between peaks 22 and 21. The deepest peak 21 is 1–3 micrometers into the surface of the semiconductor substrate. The concentration of N type impurity at peak 21 is not less than $1\times10^{17}$ atoms/cm$^3$. P is employed as an N type impurity. The threshold of a transistor is influenced by peak 22.

Figure 4:
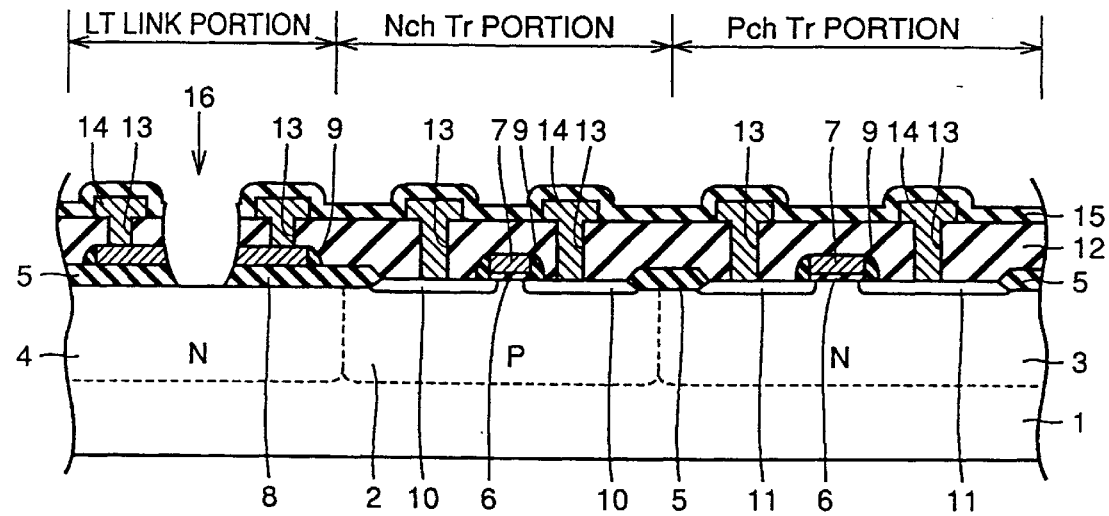
FIG. 4 is a sectional view of the semiconductor device after the LT blow according to the first embodiment.

FIG. 4 is a sectional view showing the device with link 8 blown after the formation of final protection film 15. In the drawing, reference character 16 represents an LT blow portion. As LT link 8 is formed on N well 4, when LT link 8 is blown, a portion of isolation oxide film 5 positioned below LT link 8 is completely removed to expose the surface of N well 4 at an opening portion of final protection film 15 formed by LT blow, as shown in the figure. At LT blow portion 16, impurity ions may possibly pass through the package to enter the semiconductor device.

In a conventional device, the characteristics of the active elements fluctuate because of the impurity ions enter up to the active region of the transistors, for example. Particularly in the case of the semiconductor device including a nonvolatile semiconductor memory element such as an EPROM or a flash memory, the charge held in the memory element apparently canceled by the charge of sodium ions and so on, to volatilize the retained data, causing the reliability failure.

In the semiconductor device according to the preferred embodiment of the invention, as the opening formed at the LT blow is in the region of N well 4, as stated above, sodium ions and so on entering through the opening are prevented from reaching the active region being gettered by N type impurity in N well 4. Therefore above described problem can be prevented.

Figure 5:
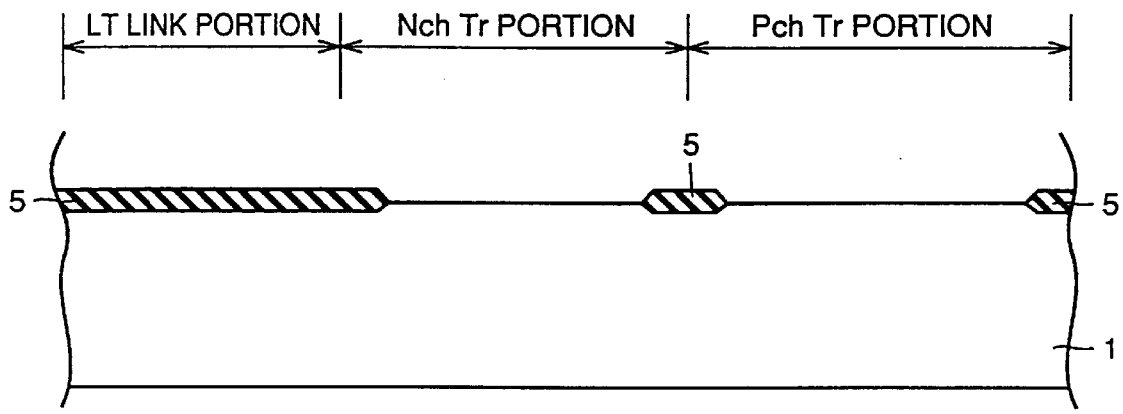
FIGS. 5 to 7 are sectional views of the semiconductor device according to the first embodiment respectively at a first to a third process steps in the manufacturing sequence of the semiconductor device.

Main process steps of the manufacturing method of the semiconductor device shown in FIG. 1 will be described. Referring to FIG. 5, field oxide film 5 is formed on semiconductor substrate 1 in order to form the LT link portion, the N channel transistor portion and the P channel transistor portion.

Figure 6:
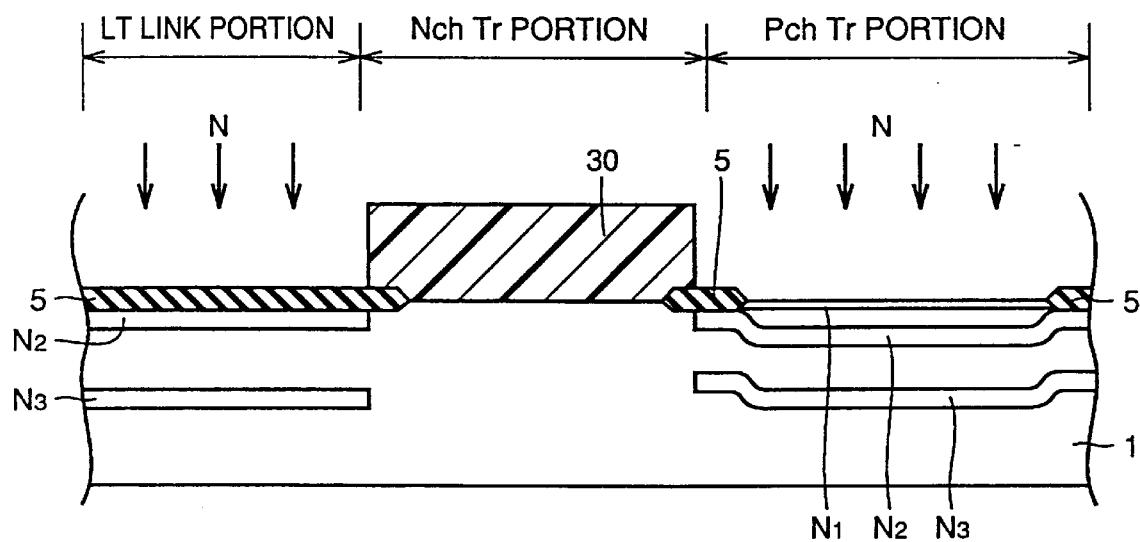

Referring to FIG. 6, after masking the N channel transistor portion by a resist mask 30, an N type impurity (P) is implanted to the semiconductor substrate employing high energy ion implantation. High energy ion implantation is performed at least three times at different energy levels. Impurity implantation is performed so as to first, bury the impurity at the surface of the semiconductor substrate 1 ($N_1$), secondly, under field oxide film 5 ($N_2$), thirdly, at the deepest point ($N_3$) (1–3 micrometers) in semiconductor substrate 1. Thus the formation of N wells 3 and 4 is completed. Any additional impurity implantation may be performed.

Figure 7:
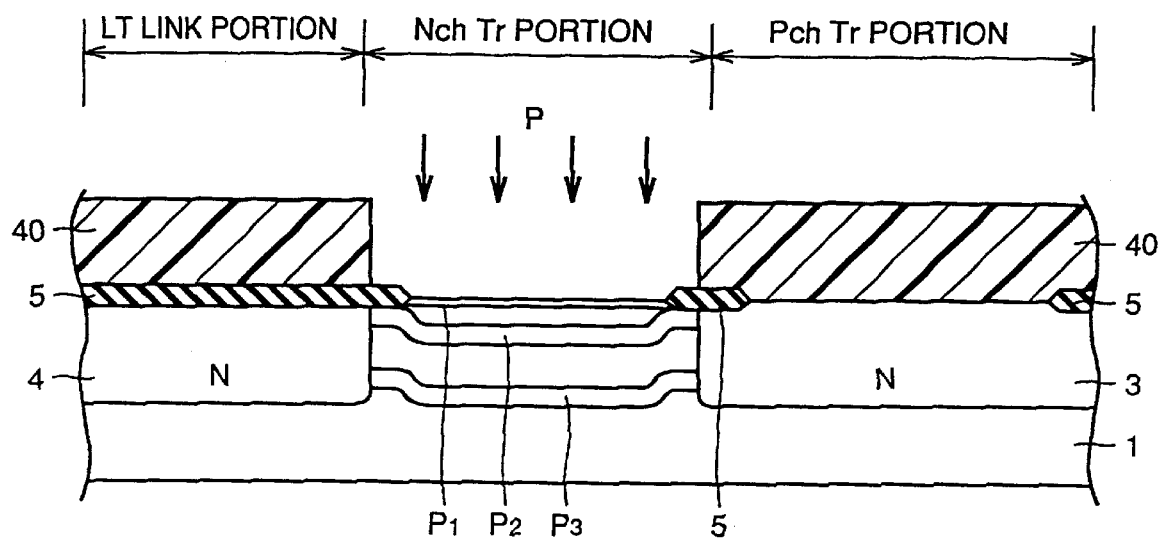

Referring to FIG. 7, after masking a portion which is to form the LT link portion and the P channel transistor portion with a resist 40, impurity implantation is performed at least three times in order to form P well 2 in the N channel transistor portion. Energy level is selected so as to bury the P type impurity at the surface of semiconductor substrate ($P_1$) by the first implantation, next directly below field oxide film 5 ($P_2$) and then at the deepest point ($P_3$) (1–3 micrometers) in the semiconductor substrate, whereby the manufacturing of P well 2 is completed.

The manufacture of the semiconductor device shown in FIG. 1 is completed by forming the LT link portion, the N channel transistor portion and the P channel transistor portion thereafter.

Second Embodiment

An exemplary embodiment is shown where N well 4 is formed simultaneously with N well 3 used in a peripheral circuitry. Preferably N well 4 has a higher concentration than the normal N well 3 in order to enhance the impurity gettering effect. In a semiconductor device according to a second embodiment, the impurity concentration of N well 4 is higher than that of normal N well 3.

The separate formation of N well 4 forming the LT link portion and N well 3 forming the P channel transistor portion allows the formation of N well 4 having a high concentration. Alternatively, a high concentration N well 4 can be formed by implanting additional N type impurity to the LT link portion after forming N well 4 simultaneously with N well 3 in the P channel transistor portion. The effect of gettering impurity entering from outside can be enhanced by providing a high concentration N well 4 in this manner.

Third Embodiment

Figure 8:
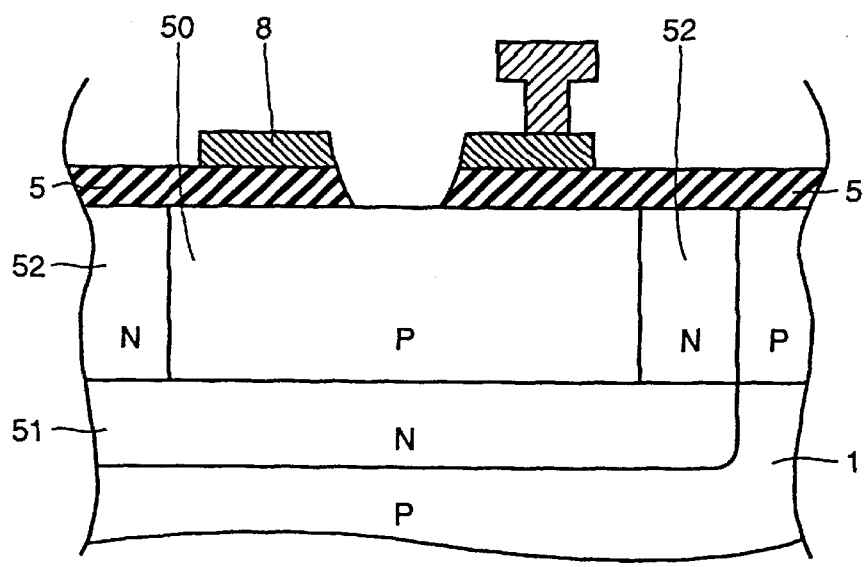
FIG. 8 is a sectional view of a semiconductor device according to a third embodiment.

FIG. 8 is a sectional view of a semiconductor device according to a third embodiment (after the LT blow) where only the LT link portion is shown in detail. Field oxide film 5 is formed in the main surface of P type semiconductor substrate 1 in order to isolate element regions from each other. Laser trimming link 8 is formed on field oxide film 5. P well 50 is formed directly below field oxide film 5 in the surface of semiconductor substrate.

A first N well 51 is formed below P well 50 in the surface of semiconductor substrate 1 such that it horizontally extends to contact with P well 50. A second N well 52 is formed such that it laterally surrounds P well 50 and connects to the first N well 51. Although the detail is not shown, the configuration of the semiconductor device according to the third embodiment is the same with that of the device shown in FIG. 1.

Even in such a configuration, impurity, such as sodium ions, entering the semiconductor device after the LT blow which exposes the surface of P well 50 would not reach the active region because of the gettering by the N type impurity in the first and the second N wells 51 and 52. Therefore, the characteristics of the active elements would not fluctuate.

In addition, in this configuration, when a negative bias is applied to LT link 8, leakage is prevented at the PN junction interface between P well 50 and the first N well 51. Moreover, at the time of the application of a positive bias to LT link 8, leakage at the PN junction interface between the first N well 51 and semiconductor substrate 1 can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device protecting an element region from contamination by an impurity entering from outside through a laser trimming link portion, comprising:

a semiconductor substrate;

an element forming P-type well provided in a surface of said semiconductor substrate and including said element region;

an element forming N-type well provided in a surface of said semiconductor substrate and including said element region and formed of a retrograde well;

a field oxide film formed in the main surface of said semiconductor substrate, for isolating an element region from another element region;

a laser trimming link formed on said field oxide film;

a laser trimming link portion N-well formed below said field oxide film and in the surface of said semiconductor substrate and formed of a retrograde well, the laser trimming link portion N-well further being completely electrically isolated from said element forming P- and N-type wells and preventing entrance of said impurity to said element forming wells;

wherein both said element forming N-type well and said laser trimming link portion N-well have an impurity concentration profile with at least two concentration peaks when a depth into the surface of the semiconductor substrate is plotted on abscissa and an impurity concentration is plotted on ordinate, respectively, among said plurality of concentration peaks, a peak at the deepest point in the surface of said semiconductor substrate has a higher impurity concentration than the other peak or peaks, said peak at the deepest point has a concentration of an N type impurity of not less than $1 \times 10^{17}$ atoms/cm$^3$, and an excess concentration peak, which does not exist in said laser trimming link portion N-well, is buried near a surface of said element forming N-type well.

2. The semiconductor device according to claim 1, wherein said peak at the deepest point is buried 1–3 micrometers into the surface of said semiconductor substrate.

3. The semiconductor device according to claim 1, wherein said N well contains P as an N type impurity.

4. The semiconductor device according to claim 1, wherein an MOSFET is formed in one of said element regions.

5. The semiconductor device according to claim 1, wherein an EPROM is formed in one of said element regions.

6. The semiconductor device according to claim 1, wherein an EEPROM is formed in one of said element regions.

7. The semiconductor device according to claim 1, wherein a flash memory is formed in one of said element regions.

8. The semiconductor device according to claim 1, further comprising:
   a P type region horizontally extended below said N well; and
   a PN junction interface between said N well and said P type region.

* * * * *